United States Patent [19]
Harada et al.

[11] Patent Number: 5,476,726
[45] Date of Patent: Dec. 19, 1995

[54] CIRCUIT BOARD WITH METAL LAYER FOR SOLDER BONDING AND ELECTRONIC CIRCUIT DEVICE EMPLOYING THE SAME

[75] Inventors: Masahide Harada, Yokohamashi; Akihiro Ando, Yokohama; Ryohei Satoh, Yokohama; Akira Yabushita, Yokohama; Naoya Kanda, Yokosuka; Kazuhiko Horikoshi, Kawasaki, all of Japan

[73] Assignee: Hitachi, Ltd., Tokyo, Japan

[21] Appl. No.: 5,353

[22] Filed: Jan. 19, 1993

[30] Foreign Application Priority Data

Jan. 22, 1992 [JP] Japan .................................. 4-009299

[51] Int. Cl.⁶ .......................... B32B 15/04; H01L 23/488
[52] U.S. Cl. ........................ 428/643; 428/668; 428/669; 428/671; 428/209; 428/901
[58] Field of Search ............................. 428/643, 668, 428/669, 671, 209

[56] References Cited

U.S. PATENT DOCUMENTS

| | | | |
|---|---|---|---|
| Re. 30,348 | 7/1980 | Hascoe | 428/643 |
| 1,029,152 | 6/1912 | Tebbetts | 428/643 |
| 1,087,561 | 2/1914 | Tebbetts | 428/643 |
| 3,206,698 | 9/1965 | Allen et al. | 428/643 |
| 3,249,408 | 5/1966 | Marafioti | 428/643 |
| 3,457,539 | 7/1969 | Lupfer | 428/669 |
| 3,579,312 | 5/1971 | Short | 428/669 |
| 4,479,892 | 10/1984 | Shibata | 252/514 |
| 4,559,279 | 12/1985 | Honjo et al. | 428/632 |
| 4,560,623 | 12/1985 | Iwata et al. | 428/668 |
| 4,839,141 | 6/1989 | Mizuhara | 428/668 |
| 5,086,966 | 2/1992 | Melton et al. | 428/463 |
| 5,156,322 | 10/1992 | Do-Thoi et al. | 428/671 |
| 5,223,347 | 6/1993 | Lhymn et al. | 428/614 |

Primary Examiner—Patrick J. Ryan
Assistant Examiner—Kam F. Lee
Attorney, Agent, or Firm—Antonelli, Terry, Stout & Kraus

[57] ABSTRACT

A solder bonding metal layer which is formed on a circuit board comprises a metal layer having a mixture of first metal which is easily wetted with metals constituting the solder and which easily forms alloy or intermetallic compounds and of second metal which is not wetted easily with the above solder and not melted. In this case, a concentration gradient that the concentration of the first metal is high on the bonding surface may be formed in the metal layer. A circuit board having a solder bonding metal layer which keeps good bonding even after many times of repairs and improves the reliability is realized.

7 Claims, 4 Drawing Sheets

CIRCUIT BOARD WITH METAL LAYER FOR SOLDER BONDING AND ELECTRONIC CIRCUIT DEVICE EMPLOYING THE SAME

BACKGROUND OF THE INVENTION

The present invention relates to a circuit board with a metal layer for solder bonding and an electronic circuit device using the circuit board. More specifically, the invention relates to a circuit board with a metal layer for solder bonding which keeps good solder bonding even after electronic parts are soldered many times and facilitates exchange of electronic parts and an electronic circuit device using the circuit board.

Every electronic circuit device including a large-scale electronic computer has many electronic circuit parts such as LSIs mounted on each printed circuit board or ceramic circuit board so as to form an electronic circuit. The typical mounting method for those electronic circuit parts is as follows: Firstly, a metal layer pattern which is a solder bonding part is formed on each circuit board (hereinafter abbreviated to a board). On the other hand, a metal terminal for an electrode is formed on each electronic circuit part. Then, the two are bonded by solder.

An electronic circuit part such as an LSI, which is mounted on a board, may be removed from the board and replaced with a new part, for example, so as to change the logic of the electronic circuit (hereinafter, this process is called repair). When the electronic circuit part is to be removed from the board, the solder bonding part of the electronic circuit part is heated and melted. In this case, a part of the metal layer constituting the bonding part of the board is removed from the board when the part is replaced. The reason is that the solder bonding is realized by alloying a part of the metal constituting the solder alloy and a part of the metal layer and a part of the alloy or the entire alloy is removed when the electronic circuit part is removed by heating and melting the solder bonding part. As an example of the bonding system which is regularly used, the bonding is realized by forming Sn—Ni alloy principally when Sn—Pb solder is used and a Ni layer is used as a metal layer. When the electronic part is removed, a part of this alloy is removed simultaneously. When a new part is to be mounted, a new metal layer at the same bounding part is consumed so as to bond solder.

To improve the production yield of electronic circuit devices, repairs are necessary. However, the metal layer is consumed by repeating repair and may be lost finally. In this state, normal bonding cannot be realized and the reliability of the solder bonding part is extremely reduced or solder bonding itself is impossible. To prevent it, it is most general conventionally to form metalization which is expected beforehand to be consumed by an allowable number of times of repairs by plating.

To satisfy recent demands for highly densed and refined pattern electronic parts, a clean forming method for metal layers of electronic parts, and highly reliable part bonding portions, there are increasing requests for forming a solder bonding metal layer with a thickness of at most 1 micron on a board by sputtering or vapor deposition in place of plating. In this case, increasing the metal layer thickness by sputtering or vapor deposition so as to realize many times of repairs is not appropriate because the residual stress of such a layer is extremely high compared with the residual stress of a layer formed by plating and the formed metal layer is cracked by the residual stress of the layer. Therefore, conventionally, a barrier (underlayer) of metal which is slow in reaction for alloying with solder or is not alloyed with solder is formed on a board by sputtering or vapor deposition and a metal layer which is easily alloyed with solder is formed on it.

Many arts relating to the above arts have been reported. One of the latest arts, for example, is indicated in 40th ECTC Proceedings, pp 408–411 (1990), "Production of MCP Carriers".

However, the method for forming metalization corresponding to the estimated number of repairs by plating beforehand among the above prior arts cannot satisfy the request for forming a solder bonding metal layer with a thickness of at most 1 micron so as to satisfy demands for highly densed and refined pattern electronic parts, a clean forming method for metal layers of electronic parts, and highly reliable part bonding portions. It is natural that the method cannot correspond to many times of repairs exceeding the estimated number of times.

The method that a metal layer which is slow in reaction for alloying with solder is formed as a barrier by sputtering or vapor deposition and a metal layer which is easily alloyed with solder is formed on it imposes a problem that the metal layer is lost finally after many times of repairs and normal bonding cannot be realized.

Furthermore, the method that metal which does not react on solder is used as a barrier and a metal layer which is easily alloyed with solder is formed on it cannot realize normal bonding after all because when the upper metal layer is lost, the metal of the barrier is not alloyed with solder.

SUMMARY OF THE INVENTION

The present invention is realized so as to solve the aforementioned conventional problems. The first object is to provide a circuit board having an improved solder bonding metal layer for holding good bonding even after many times of repairs, and the second object is to provide a method for manufacturing the circuit board, and the third object is to provide an electronic circuit device wherein electronic parts are mounted and bonded onto the circuit board, and the fourth object is to provide a method for manufacturing the electronic circuit device.

The above objects of the present invention are accomplished by the following means.

Firstly, the first object is accomplished by an electronic part mounting circuit board having a solder bonding metal layer wherein the above solder bonding metal layer is a metal layer having a mixture of first metal which is easily wetted with metals constituting the solder and which easily forms alloy or intermetallic compounds and of second metal which is not wetted easily with the above solder and not melted.

It is desirable to set a concentration gradient so that the above first metal constituting the solder bonding metal layer is high in concentration on the layer surface.

A desirable combination of the above solder components and metal layer will be described hereunder in detail.

(1) When the above solder is to be composed of at least one of Sn—Pb alloy, Sn—Bi alloy, Sn—Pb—Bi alloy, and Sn, it is desirable to select at least one of Au, Cu, Ni, and Pt as above first metal constituting the metal layer and W as above second metal.

(2) When the above solder is to be composed of at least one of Sn—Ag alloy, Sn—Sb alloy, Sn—In alloy, Pb—In alloy, Pb—Sb alloy, Au—Sn alloy, Au—Ge alloy, Sn—Ag—Sb alloy, Sn—Pb—In alloy, Sn—Pb—Sb alloy, Sn—Pb—Ag alloy, Sn—Bi—In alloy, Pb—Ag—In alloy, and Sn—Pb—Bi—In alloy, it is desirable to select at least one of Au, Cu, Ni, and Sn as above first metal constituting the metal layer and W as above second metal.

(3) When the above solder is to be composed of Pb—Bi alloy, it is desirable to select at least one of Au and Ni as above first metal constituting the metal layer and W as above second metal.

(4) Furthermore, when the above solder is to be composed of Pb—Ag alloy, it is desirable to select at least one of Au and Sn as above first metal constituting the metal layer and W as above second metal.

The second object is accomplished by a method for manufacturing a circuit board having a process for selectively forming a solder bonding metal layer constituting an electronic part bonding terminal section on the circuit board wherein the above solder bonding metal layer forming process is a process for forming a thin layer having a mixture of first metal which is easily wetted with metals constituting the solder and which easily forms alloy or intermetallic compounds and of second metal which is not wetted easily with the above solder and not melted.

It is desirable to form a layer by setting a concentration gradient so that the first metal in the solder bonding metal layer is high in concentration on the layer surface in the above solder bonding metal layer forming process. It is desirable that the above thin layer forming process is a layer forming process, for example, including one of sputtering, vacuum evaporation, ion plating, chemical vapor deposition, and plating and a process that a mask whereon a bonding part pattern is formed beforehand is mounted or contact-formed on the board and the above metal layer is selectively laminated and formed or a thin layer is formed on the board with no mask used and a predetermined etching mask is formed on this layer and selectively patterned by lithography so as to form a bonding part.

The third object is accomplished by an electronic circuit device wherein electronic parts, for example, LSIs are mounted on a circuit board by which the first object can be accomplished and the electrode terminals of the electronic parts are bonded to the solder bonding metal layer by solder. A desirable combination of the composition of solder to be used and the first and second metals constituting the metal layer which is a bonding part to the board is as mentioned above.

The fourth object is accomplished by an electronic circuit device manufacturing method having a process for positioning the electrode terminals of electronic parts on a solder bonding metal layer pattern formed on a circuit board by which the first object can be accomplished and a process for bonding the above metal layer to the electrode terminals with solder by solder reflow. A desirable combination of the composition of solder to be used and the first and second metals constituting the metal layer which is a bonding part to the board is as mentioned above.

DETAILED DESCRIPTION OF THE INVENTION

The present invention will be explained with reference to the accompanying drawings hereunder.

Figure 1:
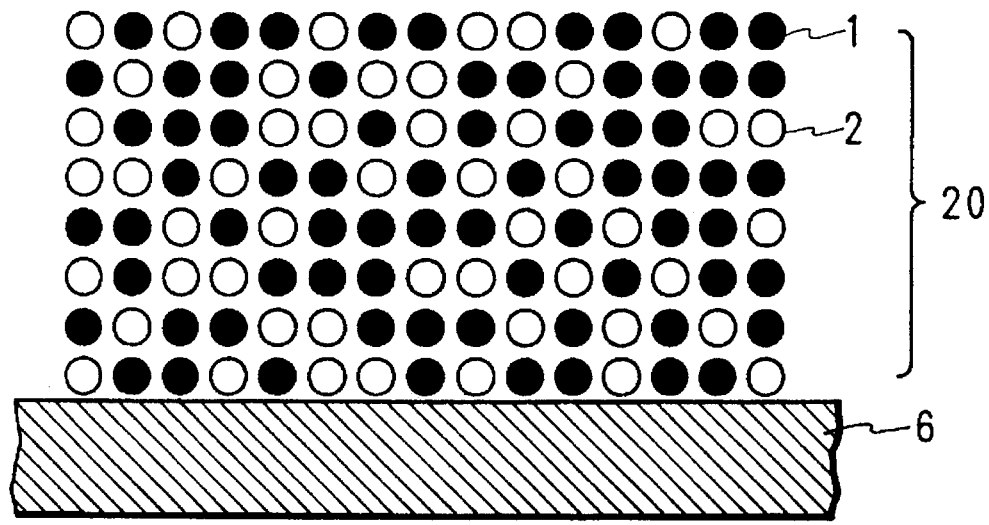
FIG. 1 is a conceptual diagram showing a section of an example of a solder bonding metal layer of the present invention.

FIG. 1 is a conceptual drawing which schematically shows an example of the section of a metal layer 20 constituting a solder bonding part formed on a substrate 6 of the present invention. According to the present invention, the metal layer 20 is formed by, for example, sputtering, vacuum evaporation, ion plating, chemical vapor deposition, or plating. By one of the above methods, the thin layer 20 wherein the metals of solder components, first metal 1 for forming intermetallic compounds at a temperature which is higher than the melting point of the solder alloy by 100 K. or lower, and second metal 2 for forming no intermetallic compounds and solid solutions with any metal constituting the solder in this temperature area is formed on the substrate 6.

Figure 2:
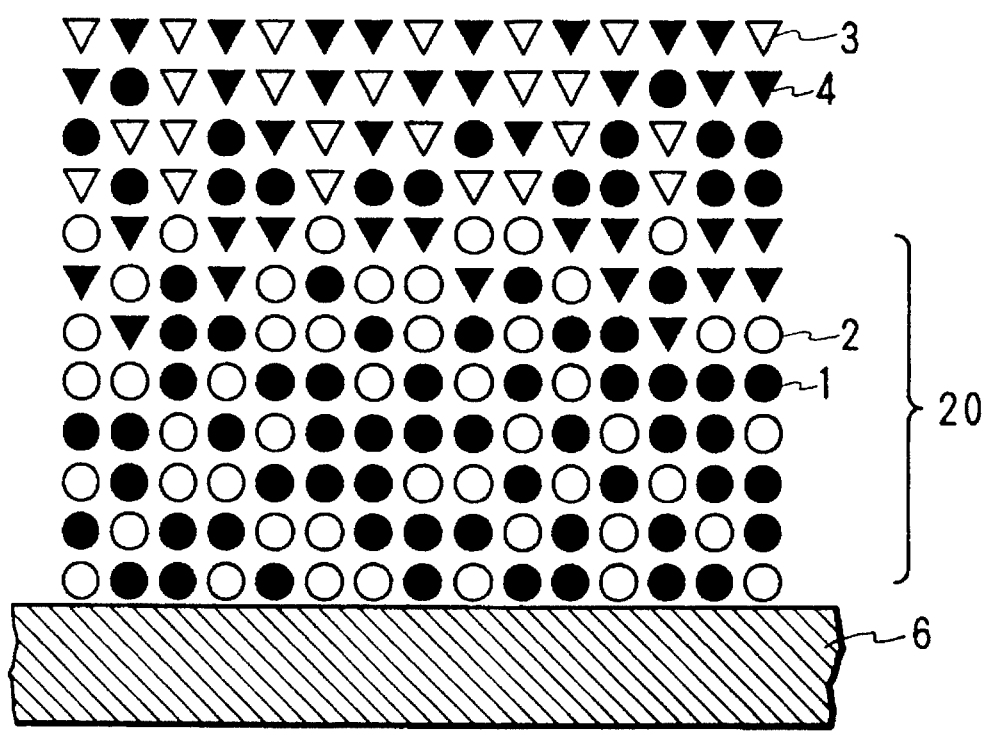
FIG. 2 is a conceptual diagram showing a section of an example of a solder bonding metal layer of the present invention when it is bonded with solder.

FIG. 2 is a conceptual diagram showing an example of a section near the metal layer 20 of the bonding part after solder is reflowed on the metal layer. In this case, the solder consists of a component 3 and component 4 and the component 4 forms an intermetallic compound with the first metal 1 at a temperature which is higher than the melting point of the solder by 100 K. or lower. In the reflow process, a part of the first metal 1 constituting the metal layer 20 attempts to form an intermetallic compound with the solder component 4, so that it is melted into the melted solder. If this occurs, the solder components 3 and 4 are replaced with the first metal 1 constituting the metal layer 20. As a result, solder alloy is formed and solder bonding is realized.

Figure 3:
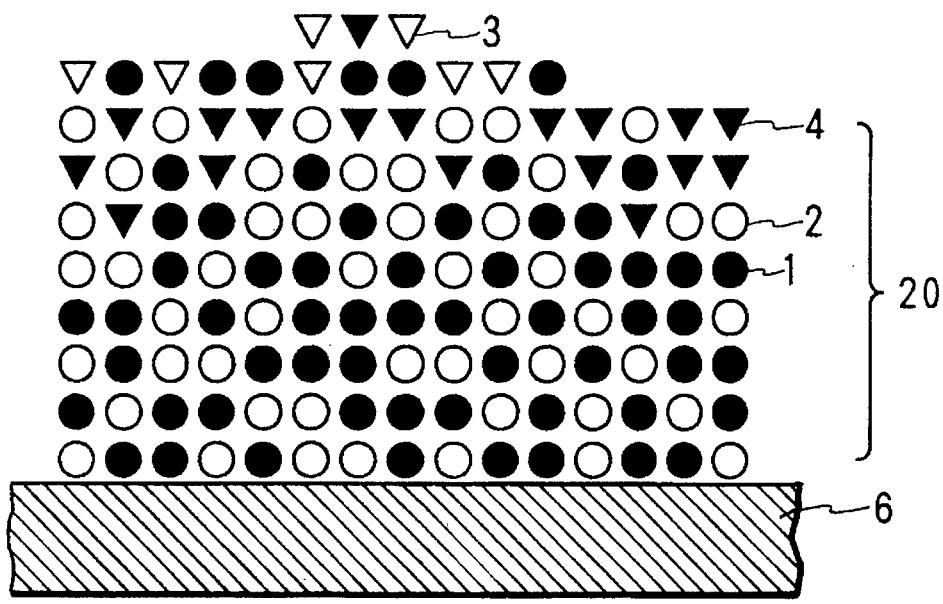
FIG. 3 is a conceptual diagram showing a section of an example of a solder bonding metal layer of the present invention when it is bonded with solder and the parts are removed.
Figure 4:
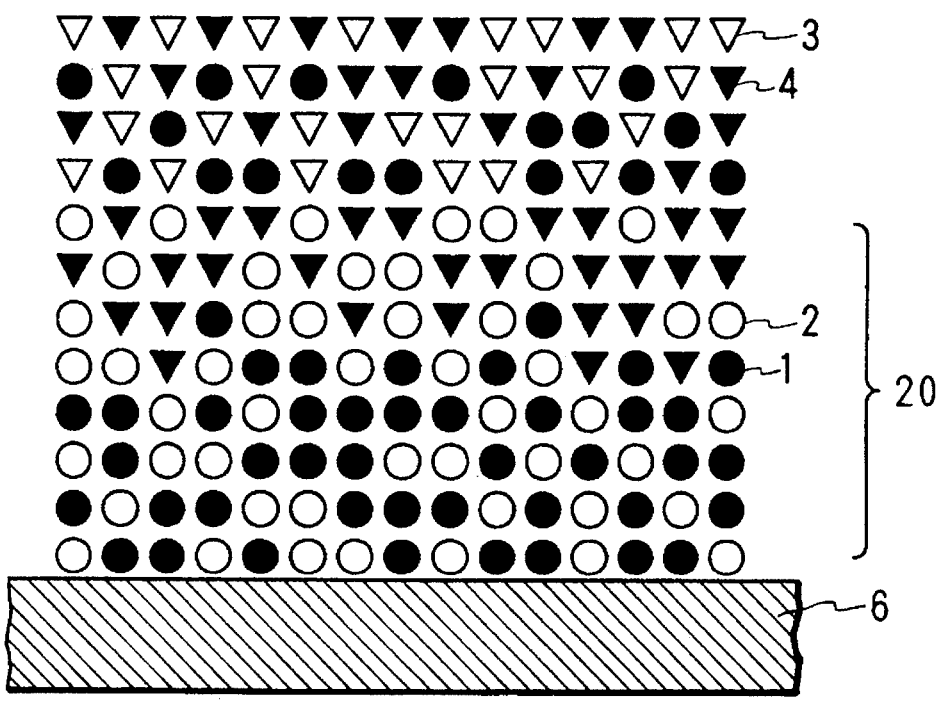
FIG. 4 is a conceptual diagram showing a section of an example of a solder bonding metal layer of the present invention when it is bonded with solder and repaired once.

Next, the behavior of the solder bonding part during repair will be explained. Firstly, when the bonding part of the substrate 6 is heated, the solder and first metal 1 which constitutes the metal layer 20 and is melted into the solder are partially melted. When any electronic part is removed, a part of this melted part is removed together with the electronic part. The remaining part of the melted alloy remains in the metal layer 20 when the electronic part is removed. The second metal 2 constituting the metal layer 20 remains in the substrate 6 when the electronic part is removed because it is not melted into the solder. FIG. 3 shows this concept schematically. A new electronic part is mounted to the remaining part of the metal layer. FIG. 4 shows this concept schematically.

Figure 5:
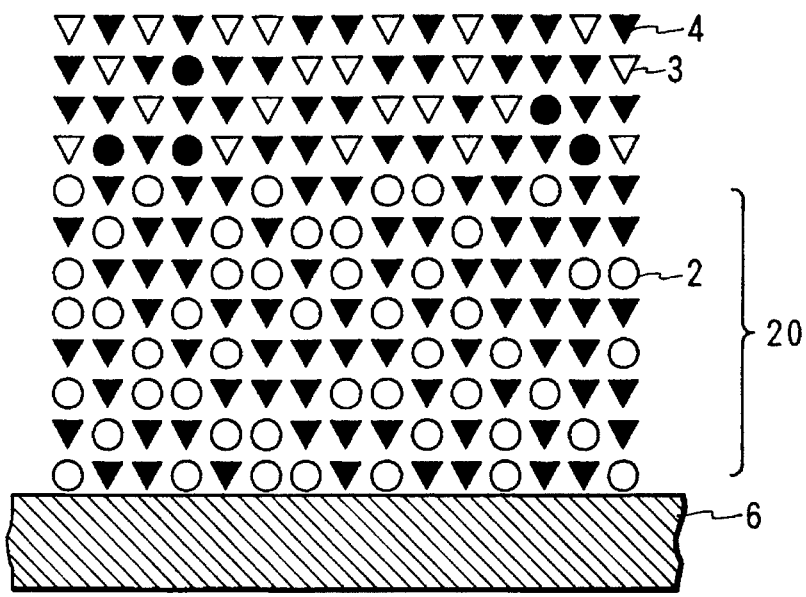
FIG. 5 is a conceptual diagram showing a section of an example of a solder bonding metal layer of the present invention when it is bonded with solder and repaired many times.

This phenomenon is repeated in the subsequent repairs. After many times of repairs, the first metal 1 constituting the metal layer 20 is melted, and one of the solder components is replaced with it, and the solder component and second metal 2 constituting the metal layer 20 coexist so as to realize bonding. FIG. 5 shows this concept schematically.

In the metal layer 20 having components of first metal 1 which is easily wetted with the above metals constituting the solder and which easily forms alloy or intermetallic compounds and of second metal 2 which is not wetted easily with any component of the solder and not melted, even when the metals 1 and 2 coexist at a concentration gradient such that the concentration of the first metal is high on the solder bonding surface side, normal bonding is realized after many times of repairs for the same reason as that mentioned above. In this case, the initial soldering surface which is constituted by the metal layer 20 is extremely wettable because the first metal 1, which forms intermetallic compounds easily with the solder, exists densely.

Next, the operation when, for example, Ni is used as above first metal 1, and W as second metal 2, and Sn—Pb alloy as solder will be explained concretely.

Ni which is the first metal 1 is alloyed easily with Sn which is a solder component so as to form an intermetallic compound and W which is the second metal 2 is not wetted easily with Sn and Pb which are solder components and not melted.

Firstly, in the area for forming the bonding part of the ceramic circuit board 6, the thin layer 20 containing Ni and W is formed by sputtering, vacuum evaporation, ion plating, chemical vapor deposition, or plating.

In the solder reflow process for bonding an electronic part, Ni (first metal 1) which is one of the components of the thin layer 20 with Ni and W mixed is melted into the melted solder because it is alloyed easily with Sn contained in the solder. This melted Ni forms an intermetallic compound with Sn. The melted Ni is replaced with Sn or Pb simultaneously. By doing this, solder bonding is realized. W (second metal 2) is not wetted easily with either Sn or Pb and not melted. The behavior near the solder bonding interface during repair is as shown below. Firstly, when the bonding part is heated, the solder and Ni—Sn intermetallic compound are partially melted. When an electronic part is removed, this melted part is partially removed together with the electronic part. The remaining part of the melted alloy remains in the Ni—W metal layer 20 of the board when the electronic part is removed. A new electronic part is mounted to this remaining part of the metal layer. This phenomenon is repeated in the subsequent repairs.

After many times of repairs, even if Ni is melted, it is replaced with Sn or Pb and the replaced component and W coexist so as to realize solder bonding.

Even in the metal layer 20 wherein Ni and W coexist so that a concentration gradient such that the concentration of Ni is high on the soldering surface is obtained, normal bonding is realized after many times of repairs for the same reason as that mentioned above. In this case, the initial soldering surface which is constituted by the metal layer 20 is extremely wettable because Ni, which forms an intermetallic compound easily with Sn contained in the solder, exists densely.

As mentioned above, the operation when Ni and W are used as an actual typical example of the metal layer 20 and Sn—Pb alloy is used as a typical example of solder is explained. However, since the operation when Au, Cu, Pt, or Sn is used as first metal 1 and alloy other than the Sn—Pb alloy is used as solder is the same, the explanation of those cases will be omitted.

DETAILED DESCRIPTION OF THE PREFERRED EMBODIMENTS

Next, the embodiments of the present invention will be explained with reference to the accompanying drawings.

Embodiment 1

Figure 6:
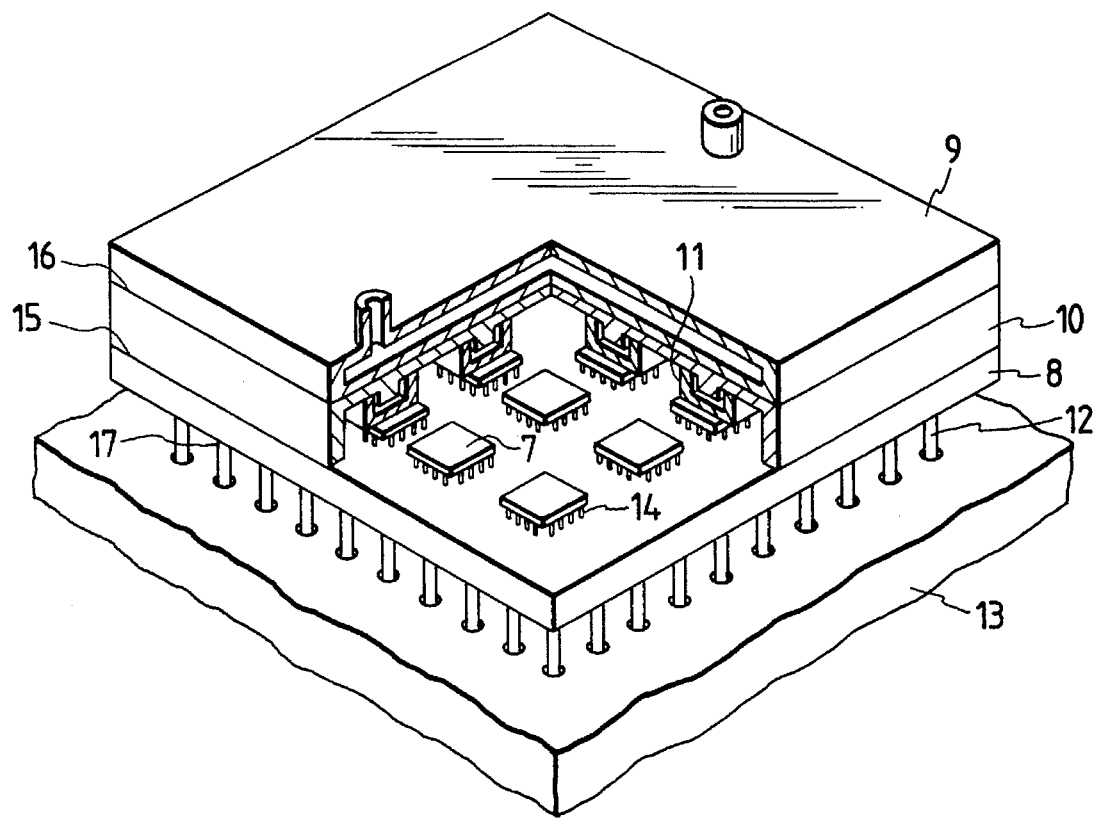
FIG. 6 is a partially broken perspective view showing the structure of an electronic circuit device of an embodiment of the present invention.

FIG. 6 is a partially broken perspective view showing an example of the electronic circuit device of the present invention.

A multilayer ceramic circuit board 8 is used as a circuit board and on the bonding part thereof, a solder bonding metal layer wherein first metal which is easily wetted with at least one type of metal of the solder components and which easily forms alloy or an intermetallic compound and second metal which is not wetted easily with any metal of the solder components and not melted coexist is formed. On this multilayer ceramic circuit board 8, an LSI chip 7 having an electrode terminal which is plated with Au is mounted as an electronic part and bonded by a small amount of solder ball 14 having components of Ag of 3 weight percent and the remainder of Sn. In this electronic circuit device, a plurality of LSI chips 7 are arranged on the multilayer circuit board 8 according to a predetermined arrangement pattern, and a heat transfer board 11 is mounted on each LSI chip, and a cap 10 is mounted on the above multilayer circuit board 8 from the heat transfer board 11 so as to cover the multilayer circuit board, and a cooling board 9 is laminated on the top of the cap 10. This multilayer circuit board 8 is bonded to a circuit board 13 via an I/O pin 12 so as to structure an electronic circuit.

Next, the electronic circuit device manufacturing method will be explained.

Firstly, a method for forming a solder bonding metal layer, which is a characteristic of the present invention, on the multilayer ceramic circuit board 8 will be explained. Firstly, in an apparatus which can sputter a plurality of targets simultaneously, for example, a dual target ion-beam sputtering apparatus, a Ni plate (first metal) of 99.999% purity and a W plate (second metal) of 99.999% purity are mounted in place as targets. Next, a stainless steel mask wherein a predetermined pattern corresponding to the shape of the bonding part is punched is put on the multilayer ceramic board 8 and the multilayer ceramic board 8 is mounted in place in the sputtering apparatus. Next, the targets of Ni and W are sputtered by an Ar ion beam simultaneously so as to laminate a thin layer wherein Ni and W is uniformly mixed (composition of Ni of 90 atomic percent and W of 10 atomic percent) up to a layer thickness of 1 micron on the multilayer ceramic board. In this case, the multilayer ceramic board may be heated up to 100° to 300° C. or so. By doing this, the solder bonding metal layer having the predetermined pattern shape is selectively formed on the board. It is also possible to form a metal layer with no stainless steel mask used and then to etch selectively the metal layer using a predetermined mask by lithography so as to form a bonding part.

Next, the LSI chip 7 plated with Au, cooling board 9, cap 10, heat transfer board 11, I/O pin 12, and circuit board 13 are prepared on the part to be soldered.

Furthermore, as to solder for assembling the device, a fine solder ball having composition of Ag of 3 weight percent and Sn of 97 weight percent as first solder, solder alloy having composition of Sn of 37 weight percent, Pb of 45 weight percent, and Bi of 18 weight percent as second solder, solder alloy having composition of Pb of 98 weight percent and Sn of 2 weight percent as third solder, and silver solder having composition of Ag of 72 weight percent and Cu of 28 weight percent are produced and prepared.

Thereafter, the above silver solder 17 is put between the back of the ceramic circuit board 8 and the I/O pin 12 and heated at 800° C. and then cooled (hereinafter, called just heat treatment) so as to bond the two.

Next, a small amount of solder ball 14 which is made of first solder alloy is put between the above solder bonding metal layer of the present invention which is formed on the surface of the multilayer ceramic circuit board 8 and the electrode terminal of the LSI chip 7 and subjected to the heat treatment at 240° C. so as to bond the two.

On the other hand, the above third solder alloy 16 is put between the cooling board 9 and the cap 10 and subjected to the heat treatment at 340° C. so as to bond the two.

Furthermore, the heat transfer board 11 is arranged on the LSI chip 7 bonded onto the multilayer ceramic circuit board 8 and then the above second solder alloy 15 is put between the periphery of the multilayer ceramic circuit board 8 and the periphery of the cap 10 which is bonded previously to the cooling board 9 and subjected to the heat treatment at 200° C. so as to bond the two.

By the aforementioned method, an electronic circuit device having electronic parts which are mounted and bonded onto the circuit board of the present invention is produced.

Next, whether the bonding method using the solder bonding metal layer of this embodiment realizes normal bonding after many times of repairs which is a technical problem of the present invention will be evaluated concretely by the following method.

To make an experiment in repair, a sample wherein a small amount of solder ball 14 which is made of first solder alloy is put between the multilayer ceramic circuit board 8 and the LSI chip 7 and subjected to the heat treatment at 240° C. so as to bond the two is prepared.

Furthermore, for comparison, from a solder bonding metal layer on a multilayer ceramic circuit board, which is prepared by the conventional method, a repair experimental sample is prepared by the method mentioned above. As a solder bonding metal layer by the conventional method, Cr is sputtered first so as to form a layer with a thickness of 0.2 microns as an underlayer (barrier) and then Ni is sputtered so as to form a layer with a thickness of 1 micron and a thin layer of two-layer structure is formed. Cr of the underlayer forms no intermetallic compound with solder.

Repair is repeated in the two samples by the following method and the solder bonding strength of the LSI chip is measured every repair.

Firstly, the chip repair method will be explained. The LSI chip mounted on the multilayer ceramic board is heated by an infrared lamp so that the temperature of the solder bonding part increases up to 240° C. and the solder bonding part melts. The LSI chip is put up in this state and removed from the board. Next, a Cu plate is put on the board at the location corresponding to the removed LSI, heated up to 240° C. by the infrared lamp, and put up in this state so that a part of the remaining solder on the board is removed and the solder bonding part on the board is flattened. Next, a new LSI chip is bonded to the multilayer circuit board with solder by the method by which the samples are prepared first. Repair is repeated by the same method hereafter.

Figure 7:
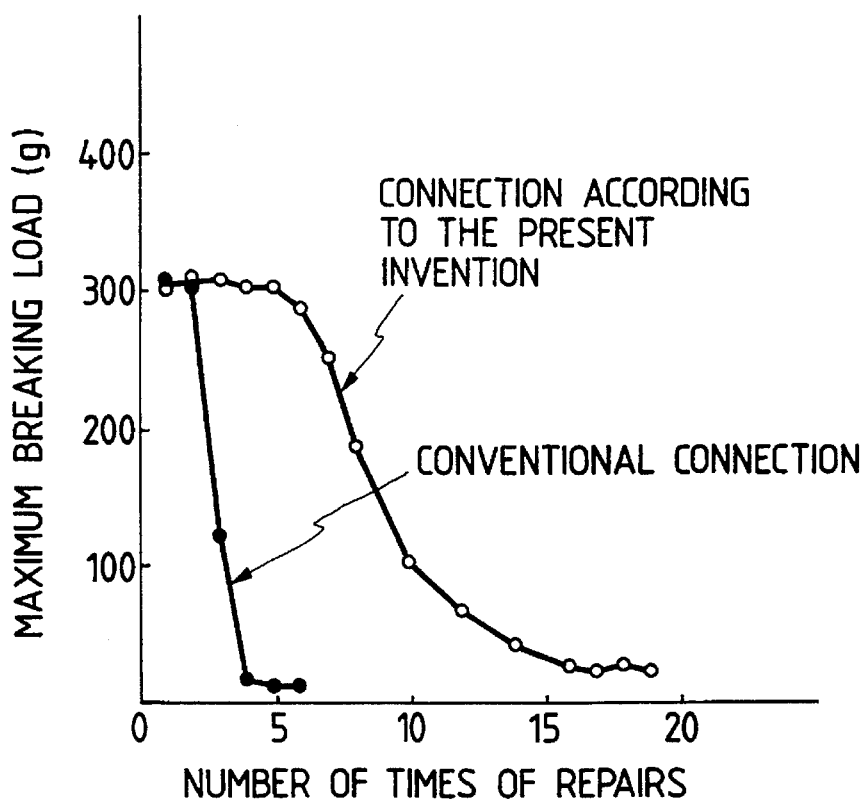
FIG. 7 shows graphs of measured results of the LSI bonding strength.

The solder bonding strength of the LSI chip at each repair is measured by the following method. Firstly, a hexagonal metal nut is bonded to the top (bonding surface without solder) of the LSI with adhesive. Next, this nut is rotated on the same plane as that of the LSI chips and the maximum force which is generated before all the solder bonding the LSI chips is broken is measured by a testing machine. The test results are shown in FIG. 7. The drawing shows that for bonding using the solder bonding metal layer (two-layer structure of Cr and Ni) by the conventional method, the strength reduces remarkably when the repair count exceeds two times and normal bonding is not realized. For bonding using the solder bonding metal layer (two types of metals Ni and W coexist) by the present invention, no reduction is found in the bonding strength until the repair count reaches five times and the repair count is improved. Therefore, the effectiveness of the present invention can be confirmed.

This embodiment shows an example that Ni is used as first metal which is easily wetted with at least one type of metal of the solder components and which easily forms alloy or an intermetallic compound and W is used as second metal which is not wetted easily with any metal of the solder components and not melted. However, it is needless to say that even when a part or the entire of Au, Cu, and Sn are used in place of Ni and solder alloy other than the Sn—Ag alloy is used, an electronic circuit device can be prepared by the same method. Additionally, the structure of the electronic circuit device shown in FIG. 6 is just an example and structures may be changed.

Embodiment 2

According to this embodiment, the metal layer manufacturing process indicated in Embodiment 1 is changed; that is, Embodiment 1 uses a thin layer wherein the first metal and second metal are uniformly mixed and Embodiment 2 has a concentration gradient that the concentration of the first metal is high on the bonding surface. A metal layer is produced by the process which is exactly the same as that of Embodiment 1 except this metal layer manufacturing method and an electronic circuit device with the structure shown in FIG. 6 is realized.

Therefore, a method for forming a solder bonding metal layer 20 having a concentration gradient which is a characteristic of the present invention will be explained hereunder. Firstly, in an apparatus which can sputter a plurality of targets simultaneously, for example, a dual target ion-beam sputtering apparatus, a Ni plate (first metal) of 99.999% purity and a W plate (second metal) of 99.999% purity are mounted in place as targets. Next, a stainless steel mask wherein a predetermined bonding pattern is punched is put on a multilayer ceramic board 6 which is a circuit board and the multilayer ceramic board 6 is mounted in place in the sputtering apparatus.

Thereafter, the W target is sputtered intensely by an Ar ion beam first so as to laminate a W layer on the multilayer ceramic board 6. When the thickness of the W layer reaches about 0.2 microns, the sputtering intensity for the W target is reduced slowly, and the Ni target is started sputtering simultaneously, and the sputtering intensity is increased slowly so that a concentration gradient is generated between the two. When the thickness of this mixed metal layer reaches 0.8 microns, the W target is stopped sputtering and only the Ni target is sputtered uninterruptedly until the Ni layer thickness reaches 0.2 microns.

By the above processes, a layer with a thickness of 0.8 microns having a mixture of Ni and W (a layer having a concentration gradient that the concentration of Ni on the solder bonding surface is high) is formed on a W layer with a thickness of about 0.2 microns and then a Ni layer with a thickness of 0.2 microns is formed on it; that is, a metal layer with a total thickness of 1 micron is formed. In this case, the multilayer ceramic board 6 may be heated up to 100° to 300° C. or so.

Parts 7 such as LSIs are mounted and bonded onto the multilayer ceramic circuit board 8 with a solder bonding metal layer which is formed as mentioned above. However, since the processes are the same as those in Embodiment 1, description will be omitted.

Next, as to whether the bonding using the solder bonding metal layer of this embodiment realizes normal bonding after many times of repairs which is a problem of the present invention, an evaluation test is performed concretely by the means used in Embodiment 1. The results are shown in FIG. 8.

Figure 8:
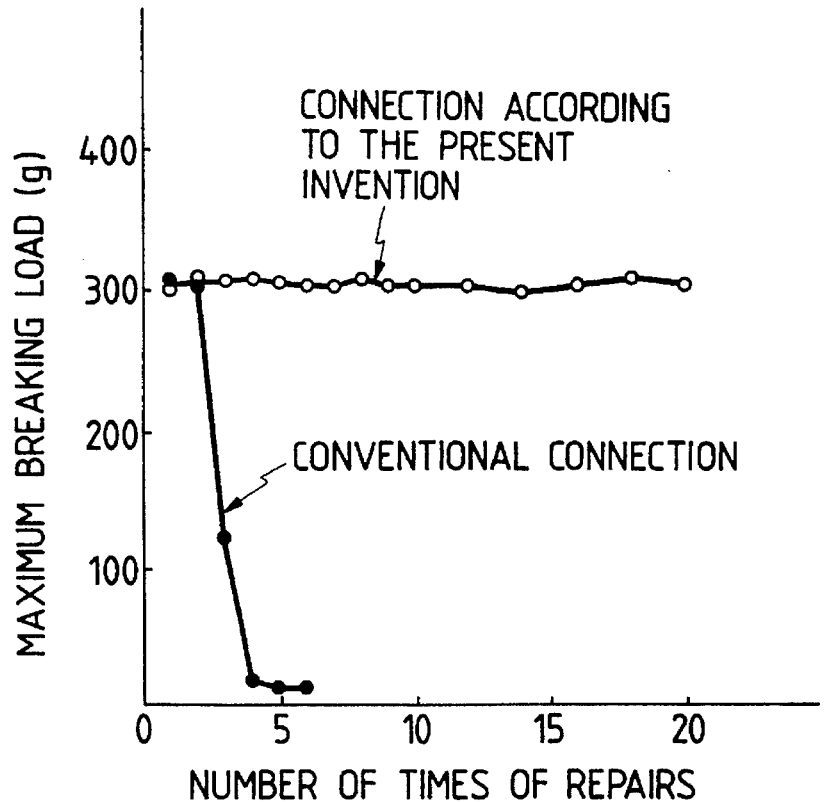
FIG. 8 shows graphs of measured results of the LSI bonding strength.

In FIG. 8, the relation between the maximum breaking load and the number of Limes of repairs is compared with that by the conventional method. The drawing shows that no reduction is observed in the bonding strength in this embodiment even when the repair count reaches 20 times and normal bonding is carried out. Since the layer containing a mixture of Ni and W in this embodiment has a concentration gradient that the concentration of Ni is high on the solder bonding surface, the wettability of solder is good compared with Embodiment 1, and the number of times of repairs increases, and solder bonding with extremely high reliability can be realized.

Although the embodiments of the present invention are described above, there are no restrictions on them and they may be changed. For example, the solder bonding metal layer of the present invention can be applied to the solder bonding location of the multilayer circuit board 8 and cap 10 of an electronic circuit device with the structure shown in FIG. 6. Furthermore, there are no restrictions on the components of the electronic circuit device shown in FIG. 6. As to forming of a solder bonding metal layer, there are no restrictions on the dual target ion beam sputtering method. For example, a method for sputtering a target plate containing a mixture of two types of metals may be used.

Embodiment 3

According to this embodiment, the metal layer structure and solder composition of Embodiment 1 are changed. The metal layer structure, solder composition, and results are shown in Table 1. The solder bonding metal layer manufacturing method is the same as that indicated in Embodiment 1, and the composition ratio between the first metal and the second metal is 80:20 in atomic percent, and the layer thickness is 1 micron.

For comparison, a solder bonding metal layer by the conventional method is a thin layer with a two-layer structure having an underlayer (barrier) of Cr with a thickness of 0.2 microns and a layer of first metal with a thickness of 1 micron.

Table 1 shows the maximum number of times of repairs for holding the initial bonding strength for each combination of Au, Cu, Ni, Pt, or Sn as a first metal, W as a second metal, and Sn—Pb, Sn—Bi, Sn—Pb—Bi, Sn, Sn—Ag, Au—Sn, Au—Ge, Pb—Bi, or Pb—Ag as solder composition. Each value in each upper row in the table indicates the number of times of repairs of bonding of the conventional metal layer structure which is used for comparison and each value in each lower row indicates the number of times of repairs of bonding of the metal layer structure of this embodiment. In every case, the number of times of repairs of the metal layer structure of the present invention is improved and good bonding is obtained.

TABLE 1

| Solder composition | Comparison of numbers of times of repairs | | | | |
|---|---|---|---|---|---|
| | First metal | | | | |
| | Au | Cu | Ni | Pt | Sn |
| Sn—Pb | 1 | 1 | 2 | 4 | |
| | 3 | 3 | 5 | 8 | |
| Sn—Bi | 1 | 1 | 2 | 4 | |
| | 3 | 3 | 5 | 8 | |
| Sn—Pb—Bi | 1 | 1 | 2 | 4 | |
| | 3 | 3 | 5 | 8 | |
| Sn | 1 | 1 | 2 | 4 | |
| | 3 | 3 | 5 | 8 | |
| Sn—Ag | 1 | 1 | 2 | | 1 |
| | 3 | 3 | 5 | | 3 |
| Au—Sn | 1 | 1 | 2 | | 1 |
| | 3 | 3 | 5 | | 3 |
| Au—Ge | 1 | 1 | 2 | | 1 |
| | 3 | 3 | 5 | | 3 |
| Pb—Bi | 1 | | 2 | | |
| | 3 | | 5 | | |
| Pb—Ag | 1 | | | | 1 |
| | 3 | | | | 3 |

As described above in detail, the expected objects can be accomplished by the present invention; that is, solder bonding with high repair resistance can be realized. To improve the production yield of electronic circuit devices which will be highly densed and integrated increasingly in the future, particularly of electronic computers, repairs of electronic parts such as LSIs are necessary and the present invention can contribute to them. The present invention also contributes greatly to improvement of reliability of the strength of the bonding part after repair.

What is claimed is:

1. A circuit board for mounting an electronic part by solder bonding which comprises a substrate and a solder bonding metal layer formed on said substrate, said solder bonding metal layer comprising a mixture of first metal which is easily wetted with metals constituting a solder to be bonded to said solder bonding metal layer and which easily forms alloy or intermetallic compounds with the metals constituting the solder and of second metal which is not wetted easily with said metals constituting the solder and which is not melted during solder bonding wherein a concentration gradient exists in said solder bonding metal layer so that the concentration of said first metal constituting the solder bonding metal layer is higher than the second metal on a surface of the solder bonding metal layer.

2. A circuit board according to claim 1, wherein said second metal constituting the solder bonding metal layer comprises tungsten.

3. A circuit board according to claim 2, wherein when said solder to be bonded to said solder bonding metal layer comprises at least one of tin-lead alloy, tin-bismuth alloy, tin-lead-bismuth alloy, and tin, said first metal constituting the solder bonding metal layer comprises at least one of gold, copper, nickel and platinum.

4. A circuit board according to claim 2, wherein when said solder to be bonded to the solder bonding metal layer comprises at least one of tin-silver alloy, tin-antimony alloy, tin-indium alloy, lead-indium alloy, lead-antimony alloy, gold-tin alloy, gold-germanium alloy, tin-silver-antimony alloy, tin-lead-indium alloy, tin-lead-antimony alloy, tin-lead-silver alloy, tin-bismuth-indium alloy, lead-silver-indium alloy, and tin-lead-bismuth-indium alloy, said first metal constituting the solder bonding metal layer comprises at least one of gold, copper, nickel, and tin.

5. A circuit board according to claim 2, wherein when said solder to be bonded to the solder bonding metal layer comprises lead-bismuth alloy, said first metal constituting the solder bonding metal layer comprises at least one of gold and nickel.

6. A circuit board according to claim 2, wherein when said solder to be bonded to the solder bonding metal layer comprises lead-silver alloy, said first metal constituting the solder bonding metal layer comprises at least one of gold and tin.

7. An electronic circuit device wherein electronic parts are mounted on the circuit board according to any one of claims 1 and 3 to 6 and electrode terminals of the electronic parts are bonded with said solder to the solder bonding metal layer.

* * * * *